United States Patent [19]

Rosnowski et al.

[11] 4,199,386
[45] Apr. 22, 1980

[54] METHOD OF DIFFUSING ALUMINUM INTO MONOCRYSTALLINE SILICON

[75] Inventors: Wojciech Rosnowski, Summit, N.J.; John M. S. Neilson, Mountaintop, Pa.

[73] Assignee: RCA Corporation, New York, N.Y.

[21] Appl. No.: 964,386

[22] Filed: Nov. 28, 1978

[51] Int. Cl.² ............................................ H01L 21/225
[52] U.S. Cl. ...................................... 148/188; 148/187
[58] Field of Search ........................... 148/188, 187, 1.5

[56] References Cited

U.S. PATENT DOCUMENTS

| 2,931,743 | 4/1960 | Rittman | 148/1.5 |
|---|---|---|---|
| 3,067,071 | 12/1962 | Mutter | 148/1.5 |
| 3,413,157 | 11/1968 | Kuiper | 148/171 X |
| 3,909,926 | 10/1975 | Hutson | 148/188 X |
| 4,029,527 | 6/1977 | Glasl et al. | 148/187 |
| 4,029,528 | 6/1977 | Rosnowski | 148/187 |
| 4,040,878 | 8/1977 | Rowe | 148/188 |
| 4,050,967 | 9/1977 | Rosnowski et al. | 148/187 X |
| 4,099,997 | 7/1978 | Rosnowski | 148/187 |
| 4,106,051 | 8/1978 | Dormer et al. | 357/71 |
| 4,154,632 | 5/1979 | Mochizuki et al. | 148/187 X |

FOREIGN PATENT DOCUMENTS 1252281  11/1971  United Kingdom .

OTHER PUBLICATIONS

Rai-Choudhury et al., *J. Electrochem. Soc.*, May, 1977, pp. 762-766.
Rosnowski, *J. Electrochem. Socl.*, Jun., 1978, pp. 957-962.

*Primary Examiner*—G. Ozaki
*Attorney, Agent, or Firm*—H. Christoffersen; D. S. Cohen; R. Ochis

[57] ABSTRACT

Uniform aluminum diffusion into monocrystalline silicon is obtained by forming a polycrystalline silicon underlayer on the surface of a monocrystalline silicon body, depositing a layer of aluminum on the polycrystalline silicon underlayer by evaporation at a temperature of less than about 250° C., depositing a silicon overlayer over said aluminum layer at a temperature less than about 250° C. and raising the temperature of said structure to between 900° C. and 1300° C. to cause the aluminum to diffuse into said monocrystalline silicon.

11 Claims, 11 Drawing Figures

METHOD OF DIFFUSING ALUMINUM INTO MONOCRYSTALLINE SILICON

BACKGROUND OF THE INVENTION

1. Field of the Invention

The invention relates to the field of diffusing aluminum into monocrystalline silicon.

2. Prior Art

Many different methods of diffusing aluminum into monocrystalline silicon have been developed. One of the known techniques involves placing silicon wafers and either elemental aluminum or an aluminum-silicon alloy into a quartz tube which is then evacuated and sealed. The sealed tube is heated to a temperature which causes the aluminum or the aluminum-silicon alloy to give off aluminum vapor and to cause that vapor to diffuse into the silicon body. Aluminum reacts easily with quartz, a reaction which interferes with the desired diffusion. To avoid this reaction, an alumina liner may be inserted into the quartz tube. This can result in surface concentrations as high as about $10^{18}$ cm$^{-3}$ as described by P. Rai-Choudhury et al. in a paper entitled "Diffusion and Incorporation of Aluminum Into Silicon" in the Journal of the Electrochemical Society for May 1977, pages 762–766. For wafers of a diameter larger than about 2 inches, the tube is usually backfilled with an inert gas such as argon to prevent the tube from collapsing as a result of the surrounding atmospheric pressure. The presence of the argon results in diffusions with low surface concentrations.

A method of utilizing aluminum vapor as a dopant source which results in diffusions with high surface concentrations is described by W. Rosnowski in the Journal of the Electrochemical Society, Volume 125, No. 6, 1978, pages 957–963. In this method, prior to the diffusion process, the tube is passivated with a mixture of $Al_2O_3$ and Si to prevent aluminum vapor from reacting with the quartz tube during the diffusion. In this method several precautions have to be undertaken to prevent the aluminum from reacting with moisture and/or oxygen.

Selective aluminum diffusion into silicon under vacuum conditions is made difficult by problems in masking against dopant penetration where no diffusion is desired. One of the known masking materials against aluminum is silicon nitride as described in British Pat. No. 1,252,281. Other masking materials are described in U.S. Pat. Nos. 4,029,528, 4,050,967, and 4,099,997 and include very thick silicon dioxide, a thick silicon dioxide layer with a thick polycrystalline silicon layer thereover, and a glass source of dopant having a silicon nitride or thick silicon dioxide layer thereover. Each of these masking materials is only effective under some conditions.

At the present time these vacuum techniques are not readily applicable to diffusing aluminum locally to a very large depth, for example, 70-100 microns. In the 1950's and more recently (U.S. Pat. Nos. 3,909,926 and 4,040,878) several methods have been developed using free aluminum metal on the semiconductor body as the dopant source. These techniques are generally considered unsatisfactory for diffusing the base regions of transistors or the base and/or gate regions in thyristors because the aluminum alloys with the silicon which degrades the silicon surface. The poor control over surface concentration and uniformity which results from alloying limits those methods to some special applications such as diffusions for diodes as described in U.S. Pat. No. 3,909,926 and grid diffusions for thyristors as described in U.S. Pat. No. 4,040,878.

Another undesirable phenomenon which can accompany aluminum diffusion into silicon is the migration of the melted aluminum out of the desired diffusion pattern during the diffusion step. This phenomenon is caused at least in part by surface tension forces involving molten aluminum. The high volatility of the aluminum at elevated temperatures and/or reaction with the ambient can result in losses of the aluminum and makes control over the diffusion process even more difficult.

SUMMARY OF THE INVENTION

The present invention overcomes these problems of the prior art by depositing a silicon overlayer over a layer of aluminum metal which has been evaporated onto the wafer into which diffusion is to take place and then heat treating the wafer to cause the aluminum to diffuse into the monocrystalline silicon of the wafer. To achieve uniform diffusion for shallow diffusions, a polycrystalline silicon underlayer is deposited on the monocrystalline silicon prior to depositing the aluminum metal. Selective diffusions are obtained by patterning the aluminum either prior to or subsequent to the deposition of the silicon overlayer.

DETAILED DESCRIPTION OF THE PREFERRED EMBODIMENT

Figure 1:
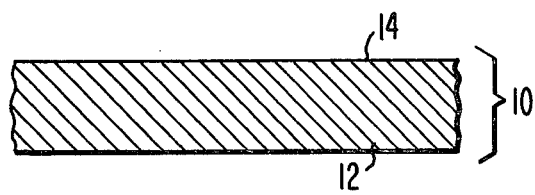
FIGS. 1–5 illustrate successive steps in the non-selective diffusion of aluminum into monocrystalline silicon.
Figure 2:
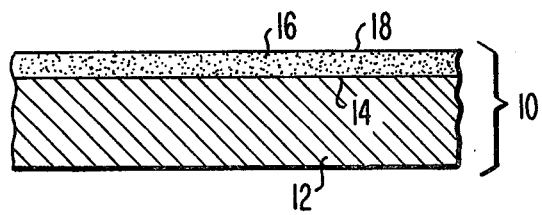
Figure 3:
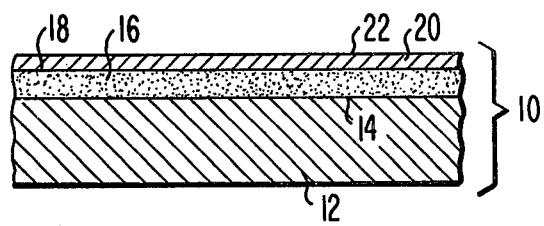

FIG. 1 illustrates a portion 10 of a semiconductor wafer comprising an N type monocrystalline silicon body 12 having a first surface 14 into which it is desired to diffuse aluminum. This wafer is cleaned in a conventional fashion and a layer 16 of polycrystalline silicon is deposited on the first surface 14 of the monocrystalline silicon 12. The polycrystalline silicon layer 16 is preferably about 2000 Å to 4000 Å thick. As illustrated in FIG. 2, layer 16 has a first surface 18 which comprises the first surface of the wafer following the formation of layer 16. The polycrystalline silicon layer 16 may be omitted for deep diffusions such as those over 2 mils deep. A layer 20 of aluminum is deposited on the first surface 18 of the polycrystalline silicon layer 16 by evaporation with the wafer held at a temperature which is less than about 250° C. (preferably less than 200° C.) to prevent premature diffusion of the aluminum. The aluminum layer 20 is preferably between 500 Å and 2500 Å thick. An aluminum layer less than 500 Å makes control difficult. An aluminum layer more than 2500 Å thick requires an extra thick silicon overlayer and requires that the wafers be heat treated in a horizontal position (during the diffusion step) to prevent molten aluminum from flowing out of the diffusion pattern. As illustrated in FIG. 3, aluminum layer 20 has a first surface 22 which now constitutes the first surface of the wafer.

Figure 4:
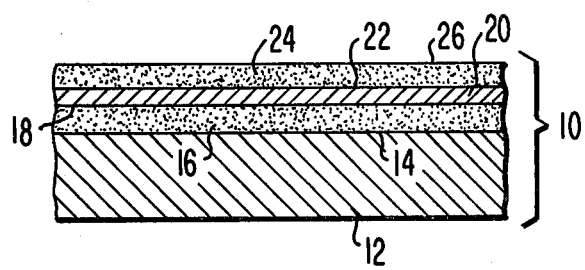

A second layer 24 of silicon is deposited onto the first surface 22 of the aluminum layer 20 by a process which does not involve heating the wafer to more than about 250° C. (preferably less than 200° C.) in order to prevent premature diffusion of the aluminum into the silicon. The preferred method of depositing the silicon layer 24 is by sputtering which produces silicon having a polycrystalline structure. The layer 24 is at least 5000 Å thick and is preferably 7000 Å to 10000 Å thick and has a first surface 26. Following the deposition of the layer 24, the portion 10 of the wafer appears as illustrated in FIG. 4 and is ready for heat treatment to cause the aluminum to diffuse into the monocrystalline silicon.

The wafer is then inserted at the end of the tube of a diffusion furnace which is set at a temperature of about 800° C. and in which the ambient atmosphere is a mixture of nitrogen and oxygen preferably having a composition comprising 6 volumes of nitrogen to 1 volume of oxygen. As is well-known in the art, the 800° C. temperature applies to the central portion of the furnace tube and not to the cooler end portion where the wafer is initially inserted. The wafer is then slowly pushed into the central portion of the furnace where it reaches the furnace temperature of about 800° C. The furnace is then set at the desired diffusion temperature of between about 900° C. to about 1300° C. to cause the aluminum to diffuse into the monocrystalline silicon 12. As is well-known, the furnace temperature slowly increases to its new set point temperature. As the temperature of the wafer increases, the aluminum alloys with the polycrystalline silicon to form a continuous aluminum doped polycrystalline silicon layer 30 having an upper surface 32. Where the underlayer 18 of polycrystalline silicon is utilized, as is illustrated in the Figures and as is preferred, alloying of the aluminum with the monocrystalline silicon 12 is prevented or minimized thereby preserving the initial high quality of the monocrystalline silicon surface 14. Once the aluminum reaches the surface 14 of the monocrystalline silicon 12 via alloying with the polycrystalline silicon and diffusing through the polycrystalline silicon, the aluminum begins to diffuse into the monocrystalline silicon.

Figure 5:
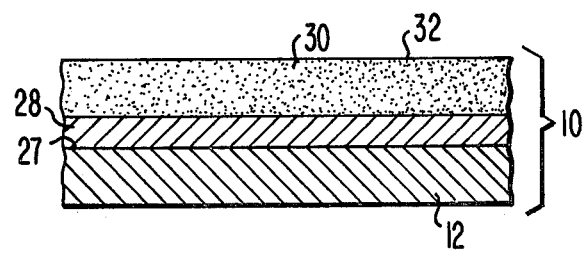

The depth to which the aluminum diffuses into the monocrystalline silicon 12 depends on the temperature at which the diffusion is performed and on the length of time during which the wafer is exposed to the diffusion temperature. In any event, the aluminum diffused region of the monocrystalline silicon 12 becomes a P type region 28 which may have a surface concentration of aluminum of about $2 \times 10^{16}$ atoms/cm$^3$ for long diffusion times which yield diffusions on the order of $50\mu$ deep or deeper. A higher surface concentration is obtained from a shorter diffusion time and a shallower diffusion. Following the diffusion step the portion 10 of the wafer appears as illustrated in FIG. 5. The PN junction between the P type region 28 and the N type region 12 is identified by the reference numeral 27. If desired, the aluminum containing polycrystalline silicon material 30 overlying the monocrystalline silicon is then removed by an appropriate process such as by etching in an etchant for polycrystalline silicon such as a boiling KOH in water solution comprising about 40wt% KOH and boiling at about 120° C.

EXAMPLE

A first 2000 Å thick layer of polysilicon was deposited on a monocrystalline silicon wafer by sputtering in the standard manner. A 1000 Å thick aluminum layer was deposited on the first polysilicon layer by evaporation using E-gun apparatus with the wafer at a temperature of substantially less than 100° C. A second layer of polysilicon was then sputtered onto the aluminum in the same manner as the first polysilicon layer with the wafer at a temperature of substantially less than 100° C. The wafer was then heated to 800° C. by slow insertion into a diffusion furnace set at 800° C. The furnace was then set to 1200° C. and the temperature increased to 1200° C. at a rate of about 6° C. per minute. After 3.5 hours at 1200° C., the furnace was turned down and the wafer removed. The resulting diffused region was about $24\mu$ deep and had a surface concentration of about $2 \times 10^{16}$ atoms/cc. After removal of the polycrystalline silicon, the monocrystalline silicon retained its original high quality surface.

Figure 6:
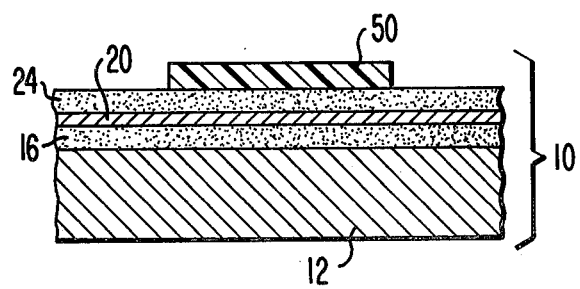
FIGS. 6–8 illustrate additional steps which are performed in one embodiment to obtain selective diffusion of aluminum into monocrystalline silicon.

If it is desired to perform a selective aluminum diffusion, the above described process for performing a non-selective diffusion is followed except for patterning the aluminum. This can be done either before or after the deposition of the silicon layer over the aluminum. If the patterning follows the silicon deposition, the non-selective process is followed through the step of depositing the second silicon layer 24 after which the wafer appears as in FIG. 4. A mask 50 is then formed on the first surface 26 of the wafer 10. As illustrated in FIG. 6, the mask 50 has protective portions in those locations where it is desired to diffuse aluminum into the monocrystalline silicon and has non-protective regions elsewhere. Using the mask 50 to protect the areas underlying its protective portions, the non-protected portions of the second silicon layer 24 are removed by an appropriate etchant. The then non-protected portions of the aluminum layer 20 are removed by an appropriate etchant such as hot phosphoric acid (at about 150° C.).

Figure 7:
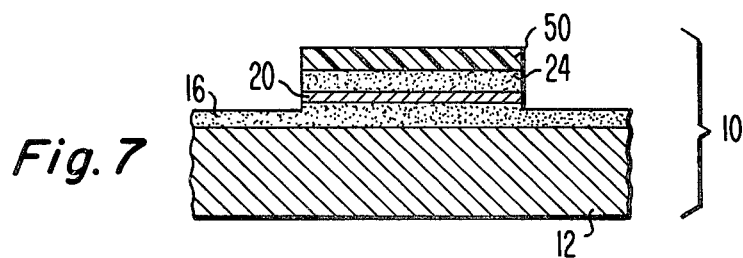
Figure 8:
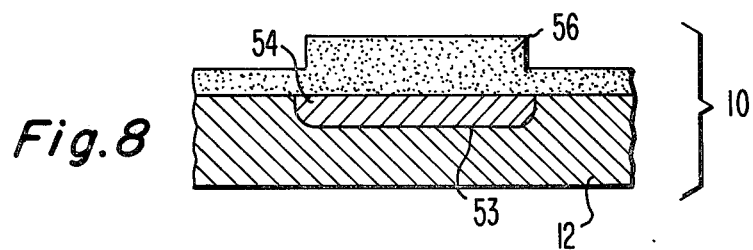

If desired in order to provide greater assurance that the removal of undesired aluminum will be complete, the then exposed portions of the first polycrystalline silicon layer 16 may be partially or totally removed from the wafer by an appropriate etchant. At the end of this etching step the portion 10 of the wafer appears as illustrated in FIG. 7. The mask 50 is then removed from the wafer 10 and the heat treatment steps of the non-selective diffusion process are performed on the selective diffusion structure in order to cause the aluminum to diffuse into the monocrystalline silicon to create a p-type region 54 in those areas underlying the portions where the aluminum layer was protected by the mask 50. Following the diffusion step the wafer 10 appears as illustrated in FIG. 8. The PN junction between the P type region 54 and the N type region 12 is identified by the reference numeral 53. The remaining polycrystalline silicon 56 may be removed using any appropriate etchant.

Figure 9:
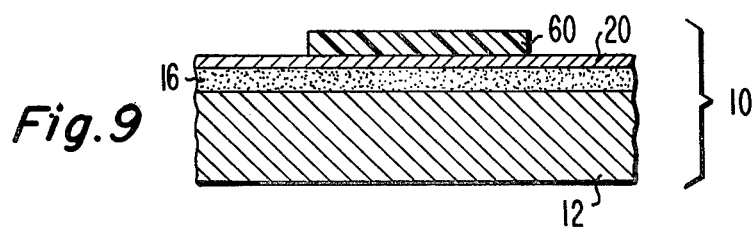
FIGS. 9–11 illustrate an alternate set of additional steps which are performed in an alternate embodiment to obtain selective diffusion of aluminum into the monocrystalline silicon.
Figure 10:
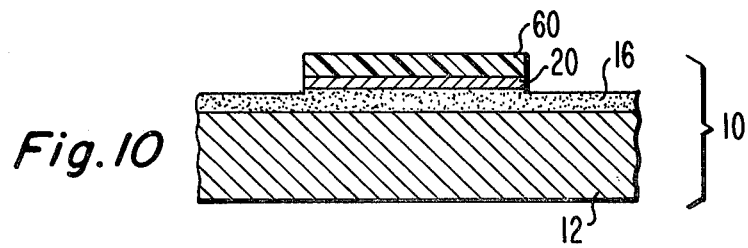

If the patterning is done before the deposition of the silicon overlayer on the aluminum, then the non-selective process is followed through the deposition of the aluminum layer 20, after which the wafer appears as in FIG. 3. A mask 60 such as photoresist is formed on the aluminum layer. As illustrated in FIG. 9, mask 60 has protective regions where aluminum diffusion is desired and non-protective regions elsewhere. The non-protected aluminum is then removed in an aluminum etchant such as hot phosphoric acid. If desired, following the aluminum etch, the surface portion (or all) of non-protected portions of polysilicon layer 16 may be removed as illustrated in FIG. 10. Any remaining photoresist is then removed.

Figure 11:
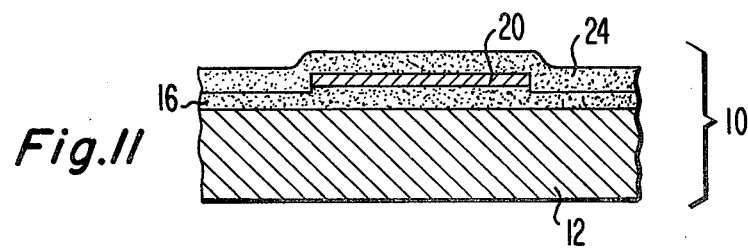

The non-selective process is then resumed with the deposition of the silicon overlayer 24, after which the wafer appears as illustrated in FIG. 11. This silicon deposition is followed by the heat treatment steps, after which the wafer appears similar to that illustrated in FIG. 8, except that the layer 56 may be relatively thicker over the non-diffused areas due to the presence of both the first and second polysilicon layers.

For relatively shallow diffusions on the order of five microns deep or less the polysilicon underlayer is needed in order to assure uniform diffusion takes place and to prevent the surface of the monocrystalline silicon from being degraded. Where deep diffusions on the order of 50μ deep or deeper are to be performed, it is not essential that the polycrystalline silicon underlayer 16 be deposited on the wafer prior to the deposition of the aluminum layer 20 since the non-uniformities of the diffusion which result from the direct contact of the aluminum with the monocrystalline silicon are substantially alleviated by the time a diffusion depth on the order of 50μ has been achieved. However, some surface degradation may occur in the absence of the polysilicon underlayer. For diffusions between 5μ and 2 mils deep the need for a first polysilicon layer varies. If a high quality surface is not important, then the polysilicon underlayer may be omitted even for shallow diffusions if diffusion uniformity is unimportant.

For shallow diffusions, the presence of the polycrystalline silicon underlayer 16 prevents the formation of non-uniform diffusions. Not all the reasons for the success of this diffusion process are fully understood. However, it is believed that the substantially total exclusion of oxygen from the vicinity of the aluminum layer 20 during the high temperature diffusion process is one of the major contributors to this effect. Another contributor to the method's success is the fact that the overlayer of silicon prevents the aluminum from evaporating during the diffusion process. An additional contributor to the method's success is the fact that the aluminum must pass through the underlayer 16 of polycrystalline silicon before reaching the surface 14 of the monocrystalline silicon. This apparently prevents surface degradation and non-uniform diffusion within the monocrystalline silicon.

It is further believed that the overlying silicon layer 24 overcomes the tendency of the aluminum to form isolated globules on the silicon surface as a result of liquid surface tension as the wafer is heated to diffusion temperatures. If this is in fact the case, then the overlying silicon layer 24 serves the purpose of maintaining the aluminum as a uniform, film diffusion-source for the diffusion of the aluminum into the polysilicon and thence into the wafer. This is a significant improvement over diffusion processes in which the aluminum is exposed on the surface of the wafer and can form isolated globules which result in a non-uniform source of aluminum for the diffusion process. Further, by preventing the formation of aluminum globules excellent definition of the areas to be diffused is obtained in selective diffusion situations. The presence of the polycrystalline silicon layer prevents the non-uniform dissolving of the monocrystalline surface which in the prior art causes surface degradation of the monocrystalline surface.

Thus, a method of achieving repeatable, uniform diffusions of aluminum into monocrystalline silicon in an economic manner has been shown and described. Various modifications can be made in the preferred embodiment which is illustrative, not limitive, without departing from the scope of the invention as defined by the following claims.

What is claimed is:

1. A method of diffusing aluminum into monocrystalline silicon comprising the steps of:
    first forming a polycrystalline silicon underlayer on a first surface of a body comprising said monocrystalline silicon;
    second forming a layer of aluminum metal on said first surface of said body while said monocrystalline silicon is at a temperature which is less than about 250° C.;
    third forming a silicon overlayer on said aluminum layer at a temperature which is less than about 250° C.; and
    raising the temperature of said body to between 900° C. and 1300° C. to cause the aluminum to diffuse into the monocrystalline silicon.

2. The method recited in claim 1 wherein said third forming step comprises sputtering a layer of polycrystalline silicon over said layer of aluminum metal.

3. The method recited in claim 1 wherein said monocrystalline silicon is maintained at a temperature of 200° C. or less during said second forming step and said third forming step.

4. The method recited in claim 1 further comprising performing the following steps after said third forming step and prior to further heat treatment of the structure:
    forming a mask on said wafer, said mask having protective regions where it is desired to selectively diffuse aluminum and having non-protective regions elsewhere;
    removing the non-protected portions of said silicon overlayer; and
    removing the non-protected portions of said aluminum layer.

5. The method recited in claim 4 further comprising performing the following step after the step of removing the non-protected portions of said layer of aluminum metal:
    at least partially removing the now unprotected portions of said polycrystalline silicon underlayer in order to insure that no undesired aluminum remains thereon.

6. The method recited in claim 1 further comprising performing the following steps after said second forming step and prior to said third forming step:
    forming a mask on said wafer, said masking having protective regions where it is desired to selectively diffuse aluminum and having non-protective regions elsewhere; and
    removing the non-protected portions of said aluminum layer.

7. The method recited in claim 6 further comprising performing the following step after the step of removing the non-protected portions of said layer of aluminum metal:
    at least partially removing the now unprotected portions of said polycrystalline silicon underlayer in order to insure that no undesired aluminum remains thereon.

8. A method of diffusing aluminum into monocrystalline silicon comprising the steps of:
    first forming a layer of aluminum metal on a first surface of a body comprising monocrystalline silicon;
    second forming a silicon overlayer on said first surface of said body while said monocrystalline silicon is at a temperature which is less than about 250° C.; and raising the temperature of said body to between 900° C. and 1300° C. to cause the aluminum to diffuse into the monocrystalline silicon.

9. The method recited in claim 8 wherein said second forming step comprises sputtering a layer of polycrystalline silicon over said aluminum.

10. The method recited in claim 8 further comprising performing the following steps after said first forming step and prior to said second forming step:

forming a mask on said wafer, said mask having protective regions where it is desired to selectively diffuse aluminum and having non-protective regions elsewhere; and removing the non-protected portions of said aluminum layer.

11. The method recited in claim 8 further comprising performing the following steps after said second forming step and prior to further heat treatment of the structure:

forming a mask on said body, said mask having protective regions where it is desired to selectively diffuse aluminum and having non-protected regions elsewhere;

removing the non-protected portions of said silicon overlayer; and removing the now unprotected portions of said aluminum layer.

* * * * *